(12) United States Patent
Rodriguez (10) Patent No.: US 9,054,692 B2
(45) Date of Patent: *Jun. 9, 2015

(54) NO POP SWITCH

(75) Inventor: Enrique O. Rodriguez, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 981 days.

This patent is subject to a terminal disclaimer.

(21) Appl. No.: 12/834,472

(22) Filed: Jul. 12, 2010

(65) Prior Publication Data

US 2011/0010750 A1    Jan. 13, 2011

Related U.S. Application Data

(60) Provisional application No. 61/225,064, filed on Jul. 13, 2009.

(51) Int. Cl.
*H04B 15/00* (2006.01)
*H03K 17/00* (2006.01)
*H03K 17/16* (2006.01)
*H03K 17/30* (2006.01)

(52) U.S. Cl.
CPC .............. *H03K 17/005* (2013.01); *H03K 17/16* (2013.01); *H03K 17/30* (2013.01)

(58) Field of Classification Search
CPC .................................. H04B 15/00; H02B 1/00
USPC ..................... 381/123, 94.5; 330/51
See application file for complete search history.

(56) References Cited

U.S. PATENT DOCUMENTS

| | | | |
|---|---|---|---|
| 4,581,541 A | 4/1986 | Nakayama et al. | |
| 4,675,905 A | 6/1987 | Flora et al. | |
| 4,788,508 A | 11/1988 | Kawai | |
| 5,222,150 A * | 6/1993 | Tajima | 381/105 |
| 6,157,726 A | 12/2000 | Carroll et al. | |
| 6,993,127 B2 | 1/2006 | Bailey | |
| 7,092,528 B2 * | 8/2006 | Patrick et al. | 381/59 |
| 7,092,533 B1 | 8/2006 | Hasegawa et al. | |
| 7,164,312 B1 * | 1/2007 | Singh et al. | 330/9 |
| 7,498,881 B2 | 3/2009 | Wang | |
| 7,827,030 B2 | 11/2010 | Smith et al. | |
| 8,098,840 B2 * | 1/2012 | Ku | 381/81 |
| 8,139,791 B1 | 3/2012 | Toosky | |

(Continued)

FOREIGN PATENT DOCUMENTS

| | | |
|---|---|---|
| CN | 101276588 A | 10/2008 |
| CN | 101409560 A | 4/2009 |

(Continued)

OTHER PUBLICATIONS

"U.S. Appl. No. 12/878,779 , Response filed Aug. 19, 2013 to Non Final Office Action mailed May 17, 2013", 12 pgs.

(Continued)

*Primary Examiner* — Disler Paul
(74) *Attorney, Agent, or Firm* — Schwegmann Lundberg & Woessner, P.A.

(57) ABSTRACT

A switch can be configured to receive a first signal at a first input and provide an output signal at an output, depending on a state of the switch. A switch state change can be delayed until an indication of a requested switch state different than a current switch state is received and the first signal reaches a threshold.

12 Claims, 3 Drawing Sheets

(56) References Cited

U.S. PATENT DOCUMENTS

| | | | |
|---|---|---|---|
| 8,155,347 B2 | 4/2012 | Li et al. | |
| 8,160,277 B2 | 4/2012 | Noethlings et al. | |
| 8,199,930 B2 * | 6/2012 | Wu | 381/94.5 |
| 8,625,818 B2 | 1/2014 | Stultz et al. | |
| 8,934,642 B2 | 1/2015 | Stultz et al. | |
| 2004/0151329 A1 | 8/2004 | Judge et al. | |
| 2006/0238247 A1 | 10/2006 | Kang | |
| 2008/0240464 A1 * | 10/2008 | Noethlings et al. | 381/94.5 |
| 2008/0312932 A1 | 12/2008 | Smith et al. | |
| 2009/0160412 A1 | 6/2009 | Latham et al. | |
| 2009/0208032 A1 * | 8/2009 | Wu | 381/94.5 |
| 2011/0163783 A1 | 7/2011 | Stultz et al. | |
| 2014/0098297 A1 | 4/2014 | Stultz et al. | |

FOREIGN PATENT DOCUMENTS

| | | |
|---|---|---|
| CN | 101419792 A | 4/2009 |
| CN | 102025355 A | 4/2011 |
| CN | 102437840 A | 5/2012 |
| DE | 102011112859 A1 | 3/2012 |
| JP | 0621791 A | 1/1994 |
| JP | 2011024208 A | 2/2011 |
| JP | 201260643 A | 3/2012 |
| KR | 20110006632 A | 1/2011 |
| KR | 1020120026467 A | 3/2012 |
| TW | 200727722 A | 7/2007 |
| TW | 201126904 A | 8/2011 |
| TW | 201230682 A | 7/2012 |

OTHER PUBLICATIONS

"U.S. Appl. No. 12/878,779, Non Final Office Action mailed May 17, 2013", 20 pgs.

"U.S. Appl. No. 12/878,779, Notice of Allowance mailed Sep. 4, 2013", 9 pgs.

"U.S. Appl. No. 14/103,013, Non Final Office Action mailed Feb. 25, 2014", 15 pgs.

"U.S. Appl. No. 14/103,013, Preliminary Amendment mailed Dec. 12, 2013", 7 pgs.

"Chinese Application Serial No. 201010511652.3, Office Action mailed Sep. 2, 2013", w/English Translation, 10 pgs.

"Chinese Application Serial No. 201110281331.3, Office Action mailed Nov. 22, 2013", w/English Translation, 13 pgs.

"U.S. Appl. No. 14/103,013, Response filed May 27, 2014 to Non Final Office Action mailed Feb. 25, 2014", 11 pgs.

"Chinese Application Serial No. 201010511652.3, Response filed Mar. 17, 2014 to Office Action mailed Sep. 2, 2013", 17 pgs.

"Japanese Application Serial No. 2010-158207, Office Action mailed Feb. 25, 2014", 2 pgs.

"U.S. Appl. No. 14/103,013, Notice of Allowance mailed Sep. 10, 2014", 8 pgs.

"U.S. Appl. No. 14/103,013, Response filed Aug. 25, 2014 to Final Office Action mailed Jul. 8, 2014", 8 pgs.

"Chinese Application Serial No. 201010511652.3 Response Filed Nov. 25, 2014 to Non-Final Office Action Mailed Jul. 10, 2014", With the English claims and the English translation of the Office Action, 16.

"Chinese Application Serial No. 201010511652.3, Office Action mailed Feb. 13, 2015", with English translation of claims, 5 pgs.

"Chinese Application Serial No. 201110281331.3, Response filed May 28, 2014", with English translation of claims, 15 pgs.

"Japanese Application Serial No. 2010-158207, Office Action mailed Aug. 12, 2014", 1 pg.

"Taiwanese Application Serial No. 099123009, Office Action mailed Feb. 12, 2015", 10 pgs.

* cited by examiner

NO POP SWITCH

CLAIM OF PRIORITY

This application claims the benefit under 35 U.S.C. 119(e) of U.S. Provisional Application No. 61/225,064, entitled "NO POP SWITCH," filed on Jul. 13, 2009, which is hereby incorporated by reference in its entirety.

BACKGROUND

Generally, switching between two or more signals at different potentials can result in a sudden change that can be harmful or undesirable. For example, switching between different audio or video signals at different potentials can result in an audio pop, a visual distortion, or one or more other undesirable effects. In other examples, switching between two signals at different potentials (e.g., first and second voltage signals having different values) can lead to a sudden current spike, or one or more other harmful or undesirable effects.

OVERVIEW

In certain examples, a switch can be configured to receive a first signal at a first input and provide an output signal at an output, the output depending on a state of the switch. The present inventors have recognized that switching signals at or near the same potential can reduce sudden output changes. In an example, a switch state change can be delayed until an indication of a requested switch state different than a current switch state is received and the first signal reaches a threshold, to eliminate or reduce harmful or undesirable effects, such as audio pop, electric shock, etc.

Example 1 includes a switch including a first input configured to receive a first signal, a control input configured to receive a control signal to control a state of the switch, and an output configured to provide an output signal using the first signal and the control signal. Example 1 further includes a controller configured to receive an indication of a requested switch state, to provide the control signal to the switch, and to delay a switch state change until the indication of the requested switch state is different than a current switch state and the first signal reaches a first threshold.

In Example 2, the first threshold of Example 1 optionally includes ground.

In Example 3, the first threshold of any one or more of Examples 1-2 optionally includes a value of an input of a device coupled to the output.

In Example 4, the indication of the requested switch state change of any one or more of Examples 1-3 optionally includes an indication of at least one of a power-on request, a power-off request, or a mute request.

In Example 5, the switch state of any one or more of Examples 1-4 optionally includes a closed state configured to couple the first input to the output and an open state configured to de-couple the first input from the output.

In Example 6, the switch of any one or more of Examples 1-5 optionally includes a second input configured to receive a second signal, the second signal different than the first signal, wherein the switch state of any one or more of Examples 1-5 optionally includes a first position configured to couple the first input to the output and a second position configured to couple the second input to the output, and wherein the controller of any one or more of Examples 1-5 is optionally configured to delay the change of the switch state from the first position to the second position until the second signal reaches a second threshold.

In Example 7, the switch of any one or more of Examples 1-6 optionally includes an audio switch, the first signal includes a first audio signal, the second signal includes a second audio signal, and the output of the audio switch is configured to be coupled to a speaker.

In Example 8, the switch of any one or more of Examples 1-7 optionally includes a video switch, the first signal includes a first video signal, the second signal includes a second video signal, and the output of the video switch is configured to be coupled to a display.

In Example 9, the second threshold of any one or more of Examples 1-8 optionally includes a value of the first signal.

In Example 10, the second threshold of any one or more of Examples 1-9 optionally includes a value of the output signal.

In Example 11, the controller of any one or more of Examples 1-10 optionally is configured to delay the change of the switch state from the first position to the second position until the second signal reaches the second threshold and a specified phase.

In Example 12, the specified phase of any one or more of Examples 1-11 optionally includes at least one of a phase of the first signal or the output signal.

Example 13 includes receiving a first signal at a first input of a switch, receiving a control signal at a control input of the switch, the control signal configured to control a state of the switch, providing an output signal at an output of the switch using the first signal and the control signal, and delaying a switch state change until an indication of a requested switch state different than a current switch state is received and the first signal reaches a first threshold.

In Example 14, the delaying the switch state change of any one or more of Examples 1-13 optionally includes delaying the switch state change until the first signal reaches ground.

In Example 15, the delaying the switch state change of any one or more of Examples 1-14 optionally includes delaying the switch state change until the first signal reaches a value of an input of a device coupled to the output.

In Example 16, the delaying the switch state change of any one or more of Examples 1-15 optionally includes delaying the switch state change until an indication of at least one of a power-on request, a power-off request, or a mute request.

In Example 17, any one or more of Examples 1-16 optionally include receiving a second signal at a second input of the switch, the second signal different than the first signal, wherein the switch state of any one or more of Examples 1-16 optionally includes a first position configured to couple the first input to the output and a second position configured to couple the second input to the output, and wherein the delaying the switch state change of any one or more of Examples 1-16 optionally includes delaying the switch state change from the first position to the second position until the second signal reaches a second threshold.

In Example 18, the receiving the first signal of any one or more of Examples 1-17 optionally includes receiving a first audio signal at a first input of an audio switch, the receiving the second signal includes receiving a second audio signal at a second input of the audio switch, and the providing the output signal includes providing an output signal to a speaker.

In Example 19, the receiving the first signal of any one or more of Examples 1-18 optionally includes receiving a first video signal at a first input of a video switch, the receiving the second signal includes receiving a second video signal at a second input of the video switch, and the providing the output signal includes providing an output signal to a display.

In Example 20, the delaying the switch state change of any one or more of Examples 1-19 optionally includes delaying the switch state change from the first position to the second position until the second signal reaches a value of the first signal.

In Example 21, the delaying the switch state change of any one or more of Examples 1-20 optionally includes delaying the switch state change from the first position to the second position until the second signal reaches a value of the output signal.

In Example 22, the delaying the switch state change of any one or more of Examples 1-21 optionally includes delaying the change of the switch state from the first position to the second position until the second signal reaches the second threshold and a specified phase.

In Example 23, the delaying the switch state change of any one or more of Examples 1-22 optionally includes until the second signal reaches the second threshold and at least one of a phase of the first signal or a phase of the output signal.

Example 24 includes an audio switch including a first input configured to receive a first audio signal, a second input configured to receive a second audio signal, a control input configured to receive a control signal to control an audio switch state of the audio switch, and an output configured to provide an output signal using the received first audio signal and the control signal, wherein the audio switch state including a first position configured to couple the first input to the output and a second position configured to couple the second input to the output. Example 24 further includes a controller configured to receive an indication of a requested audio switch state change, to provide the control signal to the audio switch, and to delay a change of the audio switch state from the first position to the second position until the second audio signal reaches a threshold, the threshold including at least one of a value of the first audio signal or the output signal.

In Example 25, the controller of any one or more of Examples 1-24 is optionally configured to delay the change of the audio switch state from the first position to the second position until the second audio signal reaches the threshold and a specified phase, the specified phase including at least one of a phase of the first audio signal or a phase of the output signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, that switching one or more inputs can be controlled to eliminate or reduce harmful or undesirable effects, such as audio pop, electric shock, etc.

In an example, a switch (e.g., an analog switch) can be used to switch an audio input (e.g., turn on, turn off, mute, etc.), or to switch between multiple audio inputs. In certain examples, a fast transition in an audio output can result in an audio pop or one or more other audio distortions (e.g., caused by a sudden increase in current through a speaker). The present inventor has recognized, among other things, that an audio switch can be configured to change between the first and second audio signals when the signals are similar (e.g., similar in amplitude, similar in phase, etc.) to eliminate or reduce the audio pop or other audio distortion. In other examples, the present inventor has recognized that, when switching an audio input on or off, the audio switch can be configured to change states (e.g., between open and closed) when a first audio input reaches a threshold, or is similar to an output of the switch (e.g., prior to closing the switch, after opening the switch, etc.) to eliminate or reduce the audio pop or other audio distortion.

In an example, the switch can be controlled by adjusted or controlling a timing of the switch (e.g., introducing delay) to minimize the difference between the input and the output of the switch, such as between first and second audio signals, etc.

Figure 1:
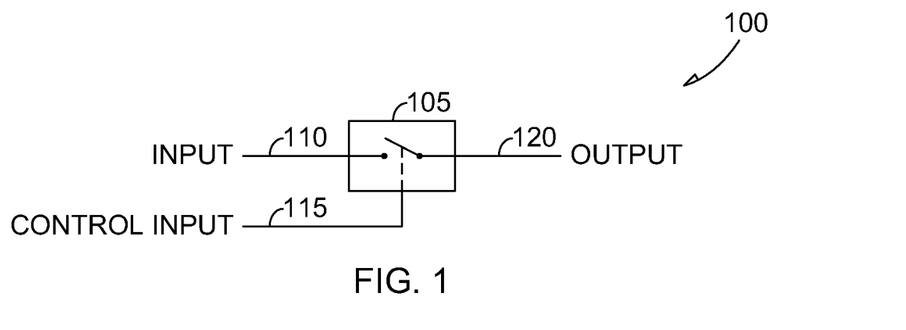
FIGS. 1 and 4 illustrate generally examples of a system including a switch configured to receive an input and to produce an output.

FIG. 1 illustrates generally an example of a system 100 including a switch 105 having a first input 110 configured to receive a first signal, a control input 115 configured to receive a control signal to control a state of the switch, and an output 120 configured to provide an output signal using the first signal and the control signal.

In an example, the first input 110 can configured to receive the first signal, such as an audio signal, a video signal, or one or more other signals. The output 120 can be coupled to a speaker, a video display, or one or more other output devices, and the switch 105 can be configured to turn on, turn off, mute, or otherwise enable, disable, or interrupt the first input 110 and the output 120.

In an example, the control input 115 can be configured to receive a control signal to control the switch 105 to eliminate or reduce audio pop or one or more other distortion associated with switching between an input signal and an output signal having different potentials. In certain examples, the difference in potential can be filtered to reduce the effect. However, doing so can require additional components or circuitry, and the resulting output signal can be changed from the original input. The present inventors have recognized that, if the first signal includes amplitude variation in time that overlaps or approaches a threshold (e.g., ground, a resting potential of an input of a device coupled to the output 120, or one or more other input signals), then the control input 115 can control the switch 105 to minimize potential adverse effects of the switching (e.g., audio pop, distortions, etc.).

In typical switching applications, the control signal controls a state of the switch 105 (e.g., open, closed, etc.) when a request to alter the state of the switch 105 is received (e.g., a power-on request, a power-off request, a mute request, a request to switch between multiple audio signals, etc.). In these examples, if the first input 110 and the output 120 are at different potentials, an audio pop or other distortion can result.

In certain examples, typical vocal frequencies can range from approximately 80 Hz to 3,000 Hz. The present inventor has recognized, among other things, that the control signal can be configured to delay a change of state of the switch 105 until the first input 110 and the output 120 (in certain examples, the potential future output, should the change of state of the switch 105 be to open) are approximately equal, or until the difference between the first input 110 and the output 120 can be minimized. In audio switching applications, even at low vocal frequencies, assuming that the first signal overlaps the output signal or one or more other thresholds, a maximum delay to the change of state of the switch 105 can be merely 0.0125 seconds (typically much less), representing one full period of the first signal at the first input 110 at low vocal frequencies. In other examples, if the first signal does not overlap the output signal or one or more other thresholds, the control signal can be configured to find a minimum difference between the first signal and the output signal or the one or more other thresholds in a first period, and then delay the change of state of the switch 105 until the minimum difference is reached in the second period. In certain examples, the control signal can be configured to provide a delay to account for a phase difference between the first input 110 and the output 120.

In other examples, the first input 110 can be configured to receive one or more signals other than audio or video signals, and the output 120 can be configured to provide the one or more signals to a device configured to receive the one or more signals. In these examples, the state of the switch 105 can be changed when the first input 110 is similar to the output 120 (or similar to an expected output), such as to minimize adverse effects associated with switching signals at different potentials (e.g., a sudden rise in current, etc.). In certain examples, when switching between multiple inputs, the state of the switch 105 can be changed when the first input 110 is similar to one or more other inputs.

Figure 2:
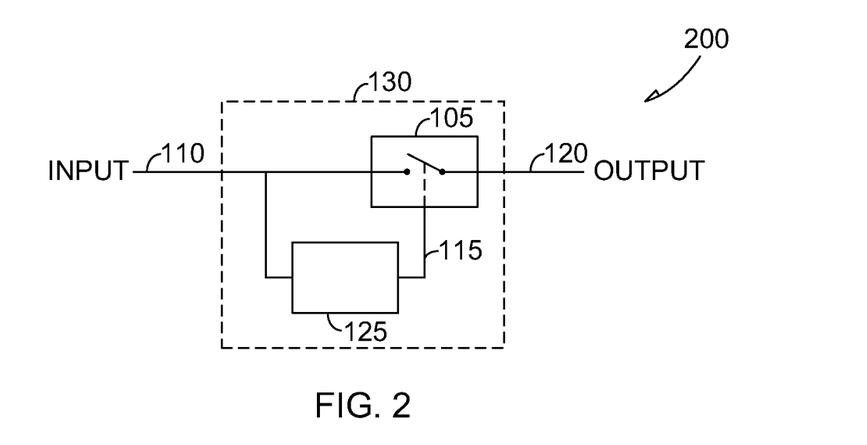
FIGS. 2-3 and 5-6 illustrate generally examples of a system including a switch module.

FIG. 2 illustrates generally an example of a system 200 including a switch module 130, the switch module 130 including a switch 105 and a controller 125. In certain examples, the controller 125 can include a digital controller (e.g., a processor, etc.), analog or digital circuitry, or one or more other controllers configured to receive a first signal from a first input 110 and to provide a control signal to a control input 115 of the switch 105. In an example, the controller 125 can be configured to delay a switch state change until an indication of a requested state change is different than a current switch state and until the first signal reaches or approaches a threshold.

In an example, the controller 125 can be configured to receive an indication of a requested switch state (e.g., from a user, from a processor, etc.). If the indication of the requested switch state is different than a current switch state and the first signal reaches a threshold, then the controller 125 can be configured to provide the control signal to the control input 115 to change the state of the switch 105.

In certain examples, the first signal at the first input 110 can be indicative of a requested switch state. For example, a user can select a signal (e.g., an audio signal, a video signal, etc.) to be provided to the output 120, and a processor can be configured to provide the signal to the switch 105. In other examples, such as without the switch 105, the first signal would be provided directly to the output 120. In this example, the presence of the first signal is indicative of a request from a user or processor to provide the first signal. In other examples, the controller 125 can receive a separate request from the user (e.g., a mute request, etc.). Once the request, or the signal indicative of the request, is received, the controller 125 can monitor the first signal at the first input 110 and control the switch to open or close at a specified amplitude, phase, etc.

In certain examples, the controller 125 can be configured to provide the control signal change the state of the switch 105 when the first signal at the first input 110 approaches or reaches a threshold. In an example, the threshold can include ground or one or more other levels, depending on the application. In an example, the threshold can include a value of an input of a device coupled to the output 120 of the switch 105, such as a speaker, a display, or one or more other devices configured to receive the output signal from the switch 105. In certain examples, the controller 125 can take into account the phase of the first signal at the first input 110, and can change the state of the switch 105 using the phase information.

Figure 3:
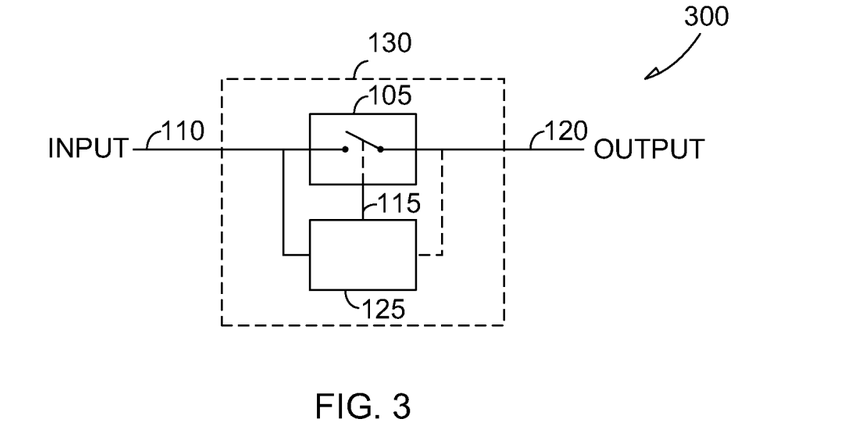

FIG. 3 illustrates generally an example of a system 300 including a switch module 130, the switch module 130 including a switch 105 and a controller 125. In this example, the controller 125 can be configured to receive a first signal from a first input 110 and an output signal from an output 120. In an example, the controller 125 can be configured to delay a switch state change until an indication of a requested switch state (e.g., open, closed, etc.) is different than a current switch state and the first signal from the first input 110 reaches or approaches the output signal from the output 120.

In other examples, if the first signal doesn't reach the output signal, then the switch state change can be delayed until the difference between the first signal and the output signal is minimized. In other examples, the switch state change can be delayed until the difference between the first signal and one or more other thresholds or other signals can be minimized (e.g., to eliminate or reduce harmful or undesirable effects).

Figure 4:
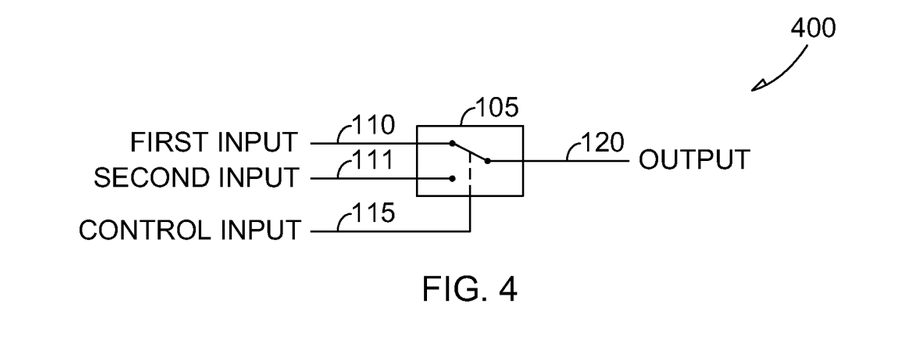

FIG. 4 illustrates generally an example of a system 400 including a switch 105 having a first input 110 configured to receive a first signal, a second input 111 configured to receive a second signal, the second signal different than the first signal, a control input 115 configured to receive a control signal to control a state of the switch, and an output 120 configured to provide an output signal using the control signal and at least one of the first signal or the second signal.

In an example, the control input 115 can be configured to receive a control signal to control the switch 105 to eliminate or reduce audio pop or one or more other distortion associated with switching between the first and second signals having different potentials, or with switching between the first or second signals and the output signal having different potentials.

In typical switching applications between multiple input signals, the control signal controls a state of the switch 105 (e.g., open, closed, etc.) when a request to alter the state of the switch 105 is received (e.g., a power-on request, a power-off request, a mute request, a request to switch between multiple audio signals, etc.). In these examples, if the first input 110 and the second input 111 are at different potentials, or if the first input 110 or the second input 111 are at different potentials with respect to the output 120, an audio pop or other distortion can result.

In certain examples, switching between first and second input signals can be similar to switching between a first signal and an output, or between a first signal and a threshold. In this example, the switch state includes a first position configured to couple the first input 110 to the output 120 and a second position configured to couple the second input 111 to the output 120. In other examples, one or more other switch configurations can be used having one or more other inputs or input configurations. For example, the switch 105 can include a first input 110 and a second input 111, each having separate switches having an open state and a closed state, configured to couple or de-couple each of the first input 110 and the second input 111 to the output 120.

In the example of FIG. 4, the switch 105 is in the first position, and the first input 110 is coupled to the output 120. In an example, when an indication of a requested switch state is received, the control signal can be configured to delay the switch state change until the indication of the requested switch state is different than a current switch state (e.g., until the indication of the requested switch state includes the second position), and until the second signal at the second input 111 reaches a threshold. In an example, the threshold can include a value (e.g., amplitude) of the first signal, such that the difference between the first and second signals is minimized when the state of the switch is changed. In other examples, the threshold can include a value of the output signal.

Figure 5:
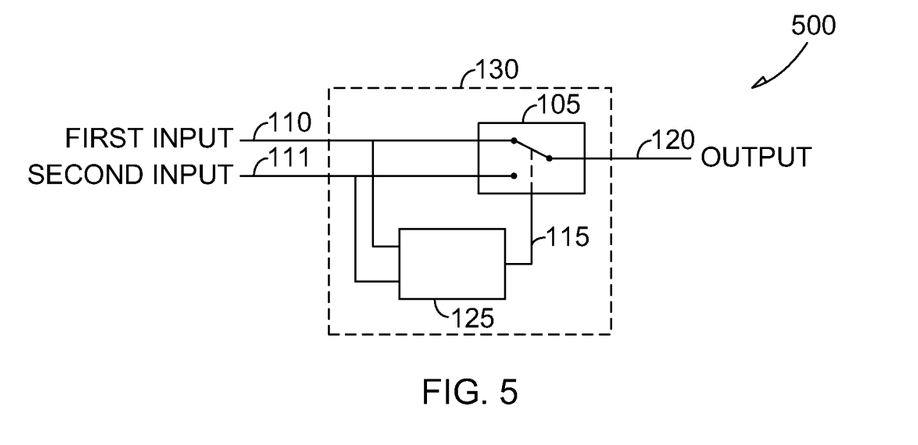

FIG. 5 illustrates generally an example of a system 500 including a switch module 130, the switch module 130 including a switch 105 and a controller 125. In an example, the controller 125 can be configured to receive a first signal from the first input 110 and a second signal from the second input 11. In an example, the controller 125 can be configured to delay a switch state change until an indication of a requested state change is different than a current switch state and until the first signal or the second signal reaches or approaches a threshold. In an example, the controller 125 can be configured to delay a switch state change until the first signal reaches or approaches the second signal. In other examples, one or more other thresholds can be used.

In an example, if the switch 105 is in a first position (coupling the first input 110 to the output 120) and an indication of a requested switch state to a second position (coupling the second input 111 to the output 120) is received, then the controller 125 can be configured to delay the switch state change from the first position to the second position until the second signal (e.g., the amplitude of the second signal) at the second input 111 reaches or approaches the first signal (e.g., the amplitude of the first signal) at the first input 110.

Figure 6:
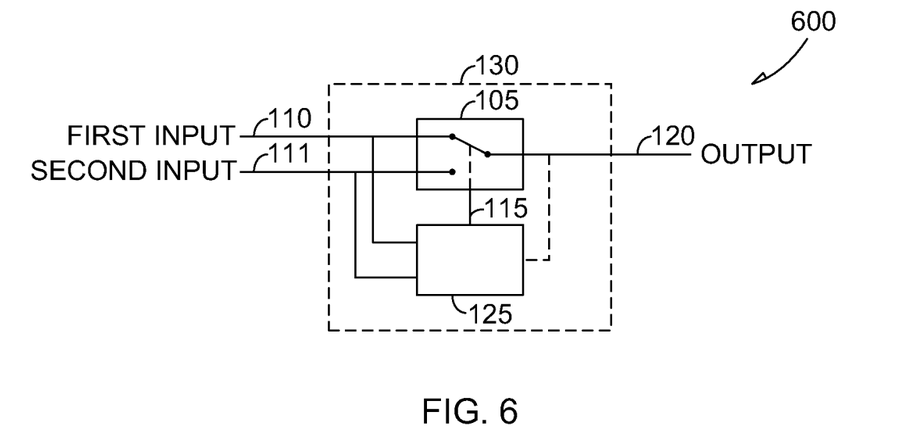

FIG. 6 illustrates generally an example of a system 600 including a switch module 130, the switch module 130 including a switch 105 and a controller 125. In this example, the controller 125 can be configured to receive a first signal from a first input 110, a second signal from a second input 111, and an output signal from an output 120. In an example, the controller 125 can be configured to delay a switch state change until an indication of a requested switch state is different than a current switch state and until the first signal from the first input 110 or the second signal from the second input 111 reaches or approaches the output signal from the output 120.

In an example, if the switch 105 is in a first position (coupling the first input 110 to the output 120) and an indication of a requested switch state to a second position (coupling the second input 111 to the output 120) is received, then the controller 125 can be configured to delay the switch state change from the first position to the second position until the second signal (e.g., the amplitude of the second signal) at the second input 111 reaches or approaches the output signal (e.g., the amplitude of the output signal) at the output 110.

Figure 7:
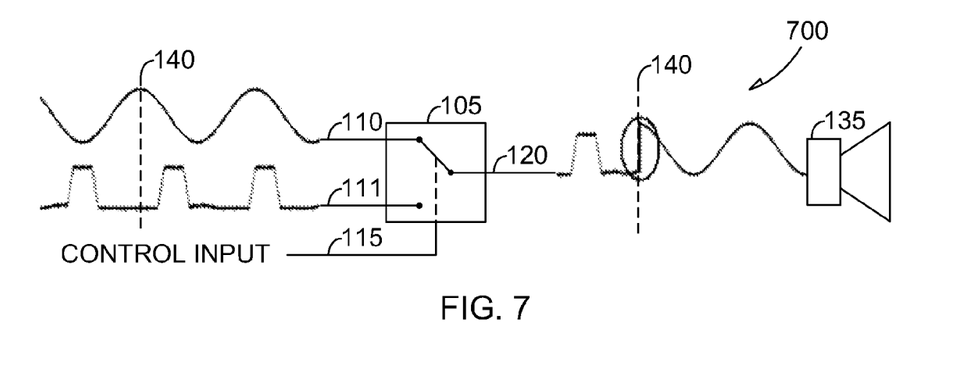
FIG. 7 illustrates generally an example of a typical switching system including an audio switch configured to receive first and second audio signals and to produce an output including an audio pop.

FIG. 7 illustrates generally an example of a typical audio switching system 700 including an audio switch 105 having a first input 110 configured to receive a first audio signal, a second input 111 configured to receive a second audio signal, a control input 115 configured to receive a control signal, and an output 120 configured to provide an output signal to a speaker 135, the output signal including an audio pop.

In this example, at time 140, an indication of a requested switch state is received, and the switch 105 changes from providing the second audio signal as the output signal to providing the first audio signal as the output signal. Because there is a difference in potential between the first and second audio signals at time 140, an audio pop or other distortion results at the output signal.

Figure 8:
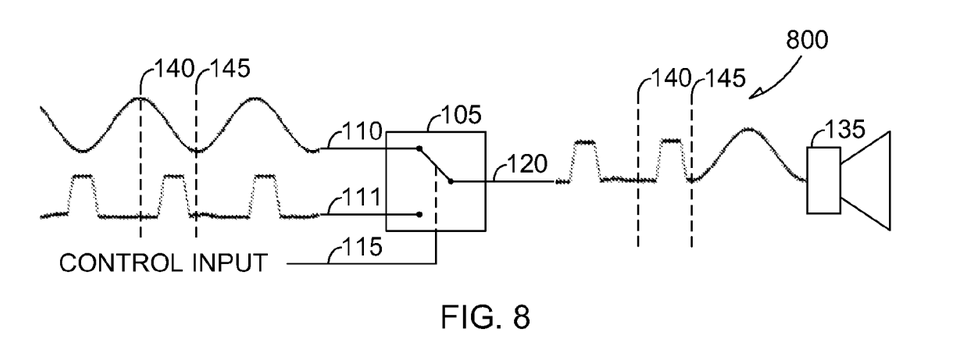
FIG. 8 illustrates generally an example of a system including an audio switch configured to receive first and second audio signals and to produce an output signal without audio pop.

FIG. 8 illustrates generally an example of a system 800 including an audio switch 105 having a first input 110 configured to receive a first audio signal, a second input 111 configured to receive a second audio signal, a control input 115 configured to receive a control signal, and an output 120 configured to provide an output signal to a speaker 135, the output signal not including an audio pop.

In this example, at time 140, an indication of a requested switch state is received, but the switch 105 does not change from providing the second audio signal as the output signal to providing the first audio signal as the output until time 145. In this example, the control signal delays the switch state change until the first signal reaches or approaches the second signal. Because there is no little or no difference in potential between the first and second audio signals at time 145, no audio pop or other distortion results at the output signal.

OTHER EXAMPLES

The present inventor has recognized, among other things, that the systems or methods described above can be used in a variety of switching applications (e.g., outside of audio or video switching) where an input signal and an output signal, or multiple input signals, can have different potentials. Further, one or more of the systems or methods described herein can be referred to as mixing technology.

In an example, mixing technology can be used to prevent the in-rush of current when switching between different potentials (e.g., switching between an input at a first potential and an output at a second different potential), potentially avoiding a short circuit condition or a shock. In certain examples, if at least one of the input or the output is variable, the switch can wait, after receiving a request to switch, until the potential at the input is at or near the potential at the output. In other examples, the switch can wait until the potential at the input is within a threshold amount from the potential at the output before switching. In an example, the threshold can be set by a user, or can vary with time. Initially, the threshold can be set at a first amount, and then, as time passes without the potential at the input being within the threshold amount from the potential at the output, the threshold can increase. In other examples, if the threshold is not reached within a period of time, an alert can be provided (e.g., similar to blowing a fuse, etc.), or a waiting period can expire and the switching can commence regardless of the difference.

In an example, the threshold can be programmable, and a user can set the threshold amount, or an actual voltage at which the switch will switch based on at least one of the input, the output, or the difference between the two.

In other examples, the difference in potential between the input and the output, or between multiple outputs, can be used determine a signal type and to switch to a signal having higher priority (e.g., giving priority to a first signal type, such as an audio signal, over a second signal type, such as USB data).

In an example, the mixing technology can be used for power-up stabilization, such as between power sources having different potentials (e.g., between a 5V source and a 3V source). In an example, when a power source is turned on, the output of the power source can gradually increase (or sometimes fluctuate) until it reaches a steady-state. In an example, when switching from a first power source to a second power source having a higher output, the switching can be delayed until the potential of the second power source is at or near the potential of the first power source. In contrast, when switching from a first power source to a second power source having a lower potential, the switching can be delayed until the difference between the potentials of the first and second power sources is minimized or otherwise meets a threshold amount.

In an example, a switch (e.g., having one or more inputs, one or more outputs, one or more channels, etc.) can self-isolate using a difference between an input and an output, or using a difference between or comparison of at least one of an input or an output and a predetermined electrical condition. In certain examples, the predetermined electrical condition can include a voltage or current threshold, a phase, a slew rate, or one or more other electrical conditions. The switching can be delayed until one or more of the conditions are met, or if the condition is met, the switch can be opened or closed, depending on the desired result. In certain examples, a closed switch can be opened, an opened switch can be closed, or a different input can be selected if at least one of the input or the output exceeds a voltage or current threshold, a slew rate, or one or more other electrical conditions.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
  a switch having first and second states, the switch including:
    a first input configured to receive a first signal;
    a second input configured to receive a second signal different from the first signal;
    a control input configured to receive a control signal to control a state of the switch;
    an output configured to provide an output signal using the control signal and at least one of the first signal or the second signal; and
    wherein the switch is configured to couple the first input to the output in the first state and to couple the second input to the output in the second state; and
  a controller configured to receive an indication of a requested switch state change from the first state to the second state, to provide the control signal to the switch, and to delay a change of the switch state from the first state to the second state until the second signal reaches a value of the output signal.

2. The apparatus of claim 1, wherein the indication of the requested switch state change includes an indication of at least one of a power-on request, a power-off request, or a mute request.

3. The apparatus of claim 1, wherein the switch includes an audio switch, the first signal includes a first audio signal, the second signal includes a second audio signal, and the output of the audio switch is configured to be coupled to a speaker.

4. The apparatus of claim 1, wherein the switch includes a video switch, the first signal includes a first video signal, the second signal includes a second video signal, and the output of the video switch is configured to be coupled to a display.

5. The apparatus of claim 1, wherein the controller is configured to delay the change of the switch state from the first position to the second position until the second signal reaches the value of the output signal and a specified phase.

6. The apparatus of claim 5, wherein the specified phase includes at least one of a phase of the first signal or the output signal.

7. A method comprising:
  receiving a first signal at a first input of a switch;
  receiving a second signal at a second input of the switch, the second signal different than the first signal;
  receiving a control signal at a control input of the switch, the control signal configured to control a state of the switch;
  providing an output signal at an output of the switch using the control signal and at least one of the first signal or the second signal; and
  receiving, at a controller, an indication of a requested switch state change from a first switch state to a second switch state; and coupling the first input of the switch to the output of the switch in the first switch state and the second input of the switch to the output of the switch in the second switch state;

delaying the switch state change from the first switch state to the second switch state until the second signal reaches a value of the output signal.

8. The method of claim 7, wherein the indication of a requested switch state change includes at least one of a power-on request, a power-off request, or a mute request.

9. The method of claim 7 wherein the receiving the first signal includes receiving a first audio signal at a first input of an audio switch, the receiving the second signal includes receiving a second audio signal at a second input of the audio switch, and the providing the output signal includes providing an output signal to a speaker.

10. The method of claim 7, wherein the receiving the first signal includes receiving a first video signal at a first input of a video switch, the receiving the second signal includes receiving a second video signal at a second input of the video switch, and the providing the output signal includes providing an output signal to a display.

11. The method of claim 7, wherein the delaying the switch state change includes delaying the change of the switch state from the first position to the second position until the second signal reaches the value of the output signal and a specified phase.

12. The method of claim 11, wherein the delaying the switch state change includes until the second signal reaches the second threshold and at least one of a phase of the first signal or a phase of the output signal.

\* \* \* \* \*